(12) United States Patent
Tseng et al.

(10) Patent No.: US 9,059,685 B2
(45) Date of Patent: Jun. 16, 2015

(54) CIRCUIT AND METHOD FOR PULSE WIDTH MEASUREMENT

(71) Applicant: TAIWAN SEMICONDUCTOR MANUFACTURING COMPANY LTD., Hsinchu (TW)

(72) Inventors: Nan-Hsin Tseng, Hsinchu County (TW); Ramakrishnan Krishnan, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 64 days.

(21) Appl. No.: 13/954,588

(22) Filed: Jul. 30, 2013

(65) Prior Publication Data

US 2015/0036785 A1   Feb. 5, 2015

(51) Int. Cl.
*H03K 21/02* (2006.01)
*H03K 3/013* (2006.01)

(52) U.S. Cl.
CPC ...................................... *H03K 3/013* (2013.01)

(58) Field of Classification Search
CPC ........ H03K 21/00; H03K 21/02; G04F 10/00; G04D 7/12; G04D 7/1207
USPC ......................................... 377/111, 20, 57, 64
See application file for complete search history.

(56) References Cited

U.S. PATENT DOCUMENTS 4,301,360 A * 11/1981 Blair ............................... 377/20
7,702,062 B2 * 4/2010 Dupont et al. ................. 377/118

* cited by examiner

*Primary Examiner* — Hai L Nguyen
(74) *Attorney, Agent, or Firm* — WPAT, P.C.; Anthony King; Kay Yang (57) ABSTRACT

A circuit for pulse width measurement comprises a charging circuit, a comparator and a determining circuit. The charging circuit is configured to charge a capacitive device in response to a periodic signal. The comparator is configured to compare a voltage across the capacitor with a reference voltage level. The determining circuit is configured to determine the number of pulses of the periodic signal in response to a signal from the comparator indicating that the voltage across the capacitor reaches the reference voltage level.

20 Claims, 5 Drawing Sheets

CIRCUIT AND METHOD FOR PULSE WIDTH MEASUREMENT

TECHNICAL FIELD

The present disclosure is generally related to pulse width measurement.

BACKGROUND

Measurement of relatively small pulse width has become increasingly important in various applications. These applications include, for example, determining exact timing characterization, securing reliability of on-chip sensors, determining critical path delay time or hold time on-chip, measuring rising and falling slew rate on-chip, determining on-chip SRAM access time, detecting static and dynamic noise margins, etc. In some semiconductor chips, delay caused by circuits is relatively small, such as in the order of 10 picoseconds. As a result, measurement of timing parameters poses a challenge. In some methods, automatic testing equipment (ATE) is employed for pulse width measurement. However, limitations on ATE make it difficult to measure the pulse width of a relatively small pulse with desirable resolution and desirable accuracy in digital circuits.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number.

Circuit for Pulse Width Measurement

Figure 1:
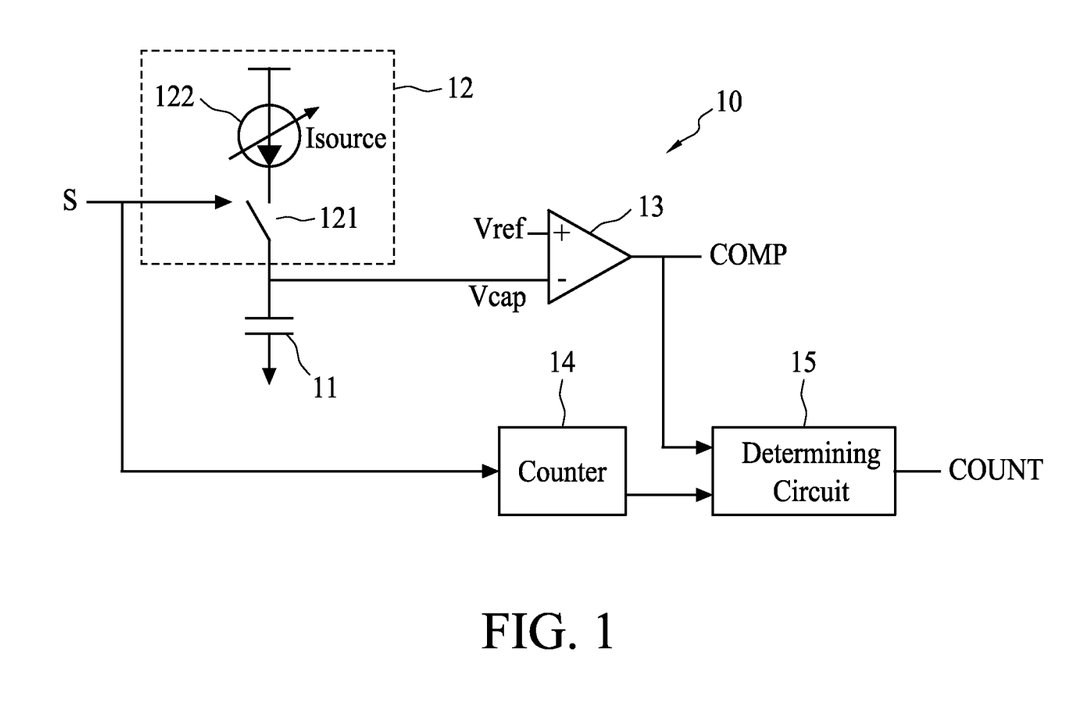
FIG. 1 is a diagram of a circuit for pulse width measurement, in accordance with some embodiments.

FIG. 1 is a diagram of a circuit 10 for pulse width measurement, in accordance with some embodiments.

Circuit 10 comprises a charging circuit 12, a capacitor 11, a comparator 13, a counter 14, and a determining circuit 15. Charging circuit 12 is configured to receive a signal S and charge capacitor 11. Charging circuit 12 comprises a control device 121 and a power source 122. In some embodiments, control device 121 includes a switch, which is turned on or off in response to the logical state of signal S. Further, power source 122 provides a current Isource towards capacitor 11. The current Isource charges capacitor 11 when control device 121 is turned on. In some embodiments, power source 122 includes a current source that generates a tunable current. Other types of power sources also fall within the scope of the disclosure.

One end of capacitor 11 is coupled with switch 121, and the other end of capacitor 11 receives a reference voltage, which, in some embodiments, is a ground voltage.

A non-inverting input (labeled "+") of comparator 13 receives a reference voltage Vref having a predetermined reference voltage level. An inverting input (labeled "−") of comparator 13 is coupled with one end of capacitor 11 and receives a voltage Vcap, which is a voltage across capacitor 11. An output of comparator 13 provides a flag signal COMP, indicating a relationship between voltage Vref and voltage Vcap. For example, in some conditions, signal COMP indicates that voltage Vcap reaches or becomes greater than voltage Vref.

Counter 14 is configured to receive signal S and count the number of pulses of signal S. An input of counter 14 receives signal S. An output of counter 14 provides the number of pulses of signal S.

An input of determining circuit 15 receives signal COMP from comparator 13. Another input of determining circuit 15 receives an output from counter 14. An output of determining circuit 15, in response to signal COMP, provides a count value "COUNT" read from counter 14.

Circuit 10 is configured to determine the number of pulses of signal S during a time period capacitor 11 is charged from 0 to Vref. In circuit 10, the charging time is a function of the pulse width of signal S and the number of pulses counted by counter 14. For example, the greater the pulse width or the smaller the number of pulses of signal S, the faster the charging time, and vice versa. However, leakage in capacitor 11 can affect the charging time. To eliminate the effect, a calibration process is used.

Circuit Calibration and Pulse Width Measurement

Figure 2:
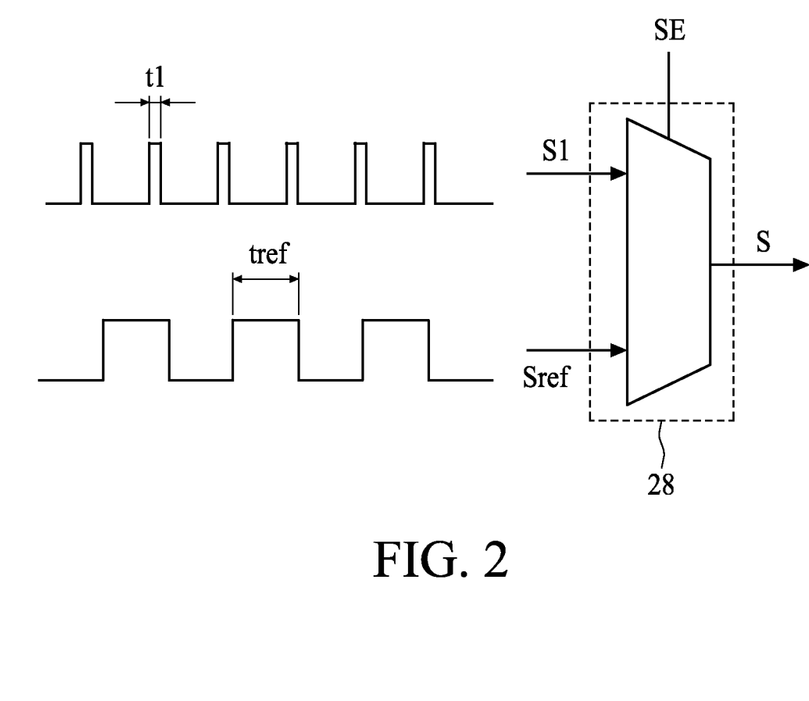
FIG. 2 is a diagram of a selecting device, in accordance with some embodiments.

FIG. 2 is a diagram of a selecting device 28, in accordance with some embodiments. Selecting device 28 is configured to select one of a signal S1 and a reference signal Sref as signal S.

In FIG. 2, an input of selecting device 28 receives signal S1, which is a periodic signal having an unknown pulse width t1. Another input of selecting device 28 receives a reference signal Sref, which is a periodic signal having a predetermined pulse width tref. Under the control of a control signal SE, an output of selecting device 28 selects one of signals S1 and Sref as signal S. Signal S is input to a circuit for pulse width measurement, for example, circuit 10 illustrated and described with reference to FIG. 1. In some embodiments, selecting device 28 comprises a multiplexer.

In some embodiments, reference signal Sref is generated by an oscillator (not shown), for example, a ring oscillator. Further, reference signal Sref has a duty cycle of 50%. Other duty cycle values of reference signal Sref are within the contemplated scope of the present disclosure. Pulse width t1 of signal S1 represents time delay caused by a circuit device when operates in a circuit (not shown). Such time delay may be in the order of 10 picoseconds, in some conditions.

Examples of the circuit device include a buffer, an inverter, a cell, a resistor, a logic gate device, etc.

In some embodiments, if signal Sref is selected as an output, signal S is signal Sref, and circuit 10 operates in a first mode, for example, a calibration mode. With reference to FIG. 1, control device 121 turns on and off in response to a corresponding logical state of signal Sref. For example, in some embodiments, control device 121 turns on in response to an active state of signal Sref that has a high logical value. In contrast, control device 121 turns off in response to an inactive state of signal Sref that has a low logical value. When control device 121 turns on, current Isource charges capacitor 11. As a result, at the end of the turn-on period of control device 121, voltage Vcap across capacitor 11 is charged to a particular voltage level. On the other hand, when control device 121 turns off, current Isource is disconnected from capacitor 11. As a result, during the turn-off period of control device 121, voltage Vcap is maintained at a voltage level previously charged at the end of the turn-on period of control device 121.

Counter 14 counts the number of pulses of signal Sref. For example, during the time period capacitor 11 is charged from 0 to Vref, resulting in voltage Vcap increasing from 0 to Vref, counter 14 counts the number of pulses of signal Sref and provides a count value COUNTref (not labeled) to determining circuit 15. Meanwhile, comparator 13 outputs signal COMP, indicating that voltage Vcap has reached Vref. Determining circuit 15, in response to the signal COMP, outputs the count value COUNTref.

A charging time period $T_c$ that capacitor 11 is charged from 0 to Vref depends on the pulse width tref of signal Sref, and is affected by leakage current in capacitor 11. The greater the pulse width tref, the smaller the number of pulses provided to charge capacitor 11 to Vref. Further, the greater amount of leakage in capacitor 11, the longer charging time period $T_c$ taken to charge capacitor 11 to Vref. Accordingly, a relationship exists between charging time period $T_c$, signal Sref having a pulse width tref used to charge capacitor 11 to Vref, the number of pulses COUNTref and leakage current due to capacitor 11, and can be expressed in equation (1) as:

$$T_c = tref * COUNTref + offset(C11) \quad \text{equation (1)}$$

where offset (C11) represents an error term due to leakage current in capacitor 11.

In contrast, if signal S1 is selected as an output of selecting device 28, signal S is signal S1 and circuit 10 operates in a second mode, for example, a measurement mode. By using circuit 100 to determine a count COUNT1 of signal S1 for the same charging time period $T_c$ as in the calibration mode, a relationship between charging time period $T_c$, pulse width t1, the number of pulses COUNT1, and leakage current due to capacitor 11 can be expressed as:

$$T_c = t1 * COUNT1 + offset(C11) \quad \text{equation (2)}$$

By comparing equation (1) and equation (2), equation (3) is obtained as follows:

$$tref * COUNTref = t1 * COUNT1 \quad \text{equation (3)}$$

Effectively, based on equations (1), (2), and (3), and by using a same capacitor 11 in the calibration mode and the measurement mode, the factor of leakage current offset (C11) due to capacitor 11 is canceled.

Further, based on equation (3), since tref is predetermined, and COUNTref and COUNT1 are obtained by counter 14 using the same charging time period T, pulse width t1 of signal S1 is calculated as:

$$t1 = (tref * COUNTref) / COUNT1$$

Figure 3:
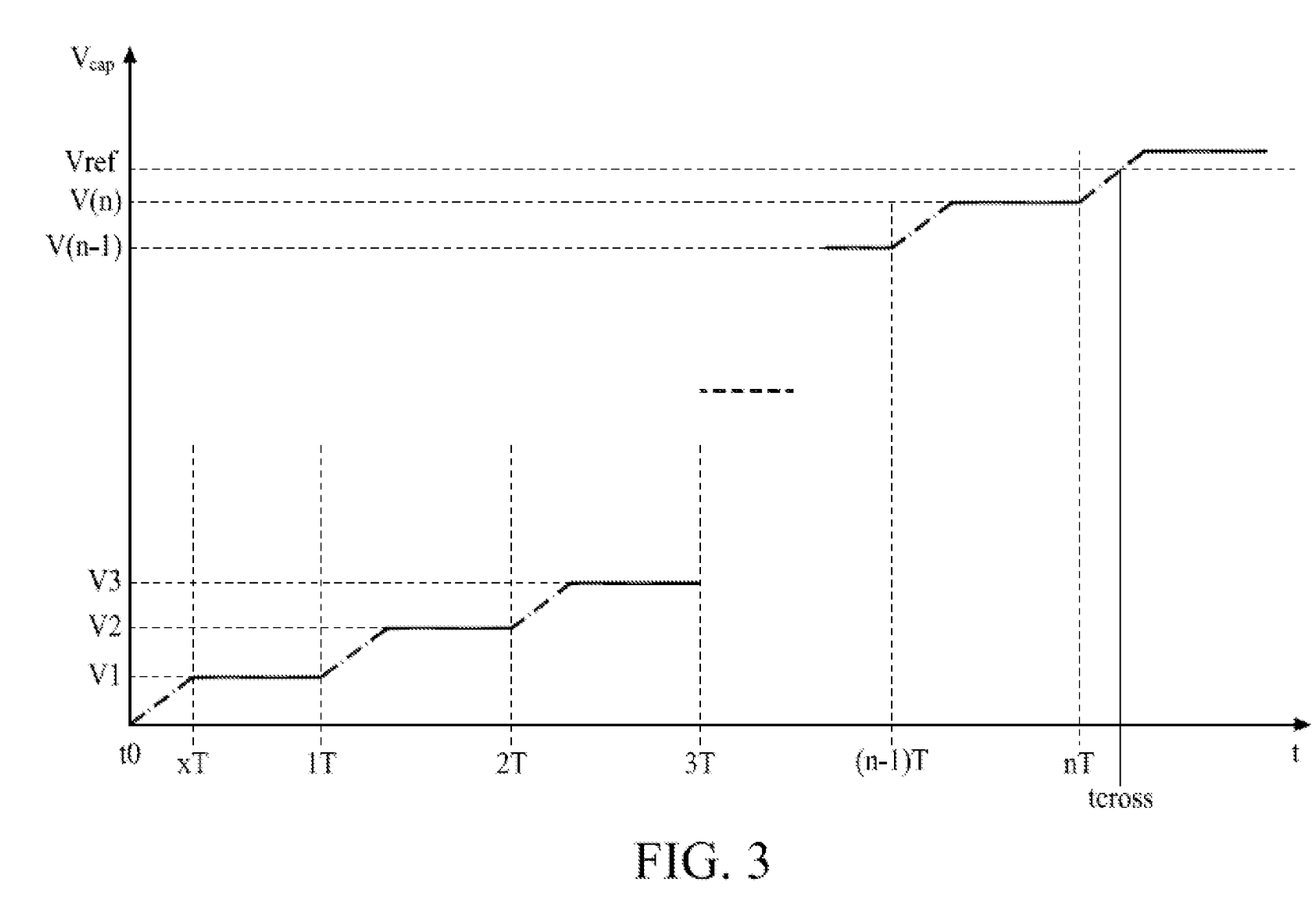
FIG. 3 is a graph of waveforms illustrating the voltage across a capacitor in FIG. 1 over time.

FIG. 3 is a graph of waveforms illustrating voltage Vcap across capacitor 11 in FIG. 1 increasing over time. For illustration, voltage Vcap, starts at 0V and increases as capacitor 11 is being charged in response to signal S in FIG. 1, which, also for illustration, is signal Sref in FIG. 2. During a first period from time t0 to 1T, in response to signal S becoming active between time t0 and time xT, capacitor 11 is charged to voltage level V1. Control device 121 then turns off as signal S becomes inactive between time xT and 1T. As a result, voltage Vcap is maintained at voltage V1 untill the end of the first period at time 1 T.

Similarly, control device 121 turns on in response to an active state of a second period of signal S between time 1T and time 2T, enabling current Isource to charge capacitor 11 again. Vcap thus increases from voltage level V1 to V2. Control device 121 then turns off in response to an inactive state of the second period of signal S, disconnecting current Isource from capacitor 11. Vcap therefore maintains at V2 untill the end of the second period at time 2T.

Control device 121 continues to turn on and off in response to the active and inactive states of signal S. Effectively, voltage Vcap increases to voltage V3, and maintains at voltage V3, and increases to voltage Vn and maintains at voltage Vn. At a time tcross, Vcap reaches Vref. As a result, comparator 13 generates signal COMP, indicating that Vcap has reached Vref. Further, in response to signal COMP, determining circuit 15 outputs count value COUNT from counter 14. Effectively, the number of pulses of signal S in FIG. 1 represented by COUNT at the charging time tcross is determined. Because, in the illustration of FIG. 3, signal S is reference signal Sref having a predetermined pulse width tref, the number of pulses COUNTref for charging time period $T_c$ of time t0 to corresponding time tcross is determined. Further, when signal S corresponds to signal S1 having an unknown pulse width t1, the number of pulses COUNT1 for charging time period $T_c$ of time t0 to corresponding time tcross can be determined. Consequently, based on equation (3), pulse width t1 of signal S1 is determined.

Circuit for Pulse Width Measurement, Additional Embodiments

Figure 4:
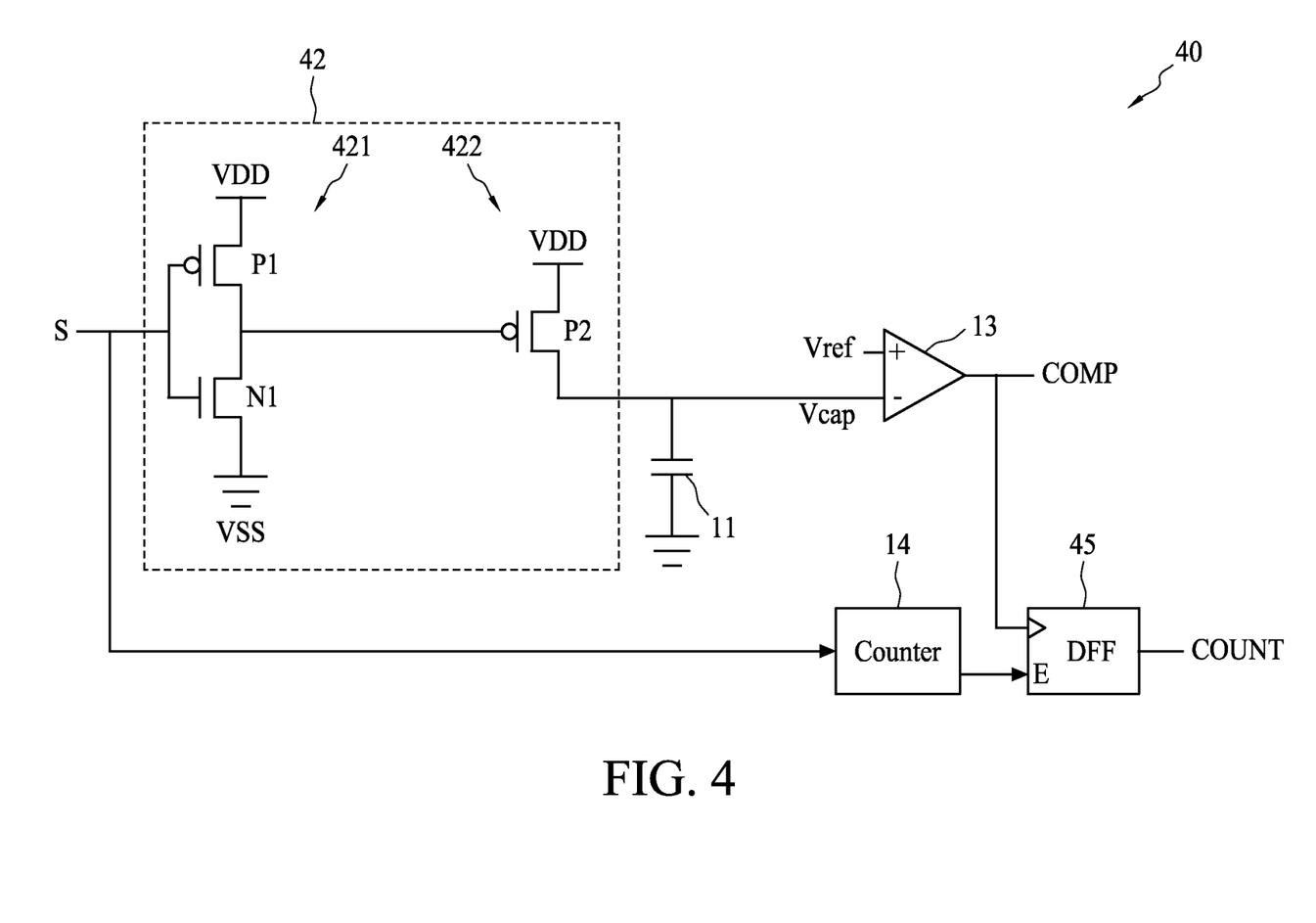
FIG. 4 is a diagram of a circuit for pulse width measurement, in accordance with additional embodiments.

FIG. 4 is a diagram of a circuit 40 for pulse width measurement, in accordance with additional embodiments. Circuit 40 is similar to circuit 10 described and illustrated with reference to FIG. 1 except that details of charging circuit 42 and determining circuit 45 that correspond to respective circuits 12 and 15 in FIG. 1 are shown.

In FIG. 4, charging circuit 42 comprises a first switching device 421 and a second switching device 422. First switching device 421 and second switching device 422 correspond to control circuit 121 in FIG. 1. First switching device 421 includes a complementary metal-oxide-semiconductor (CMOS) inverter that includes a p-type metal-oxide-semiconductor (PMOS) transistor P1 and an n-type metal-oxide-semiconductor (NMOS) transistor N1. A gate of transistor P1 receives signal S. A source of transistor P1 is coupled to a power supply VDD. A drain of transistor P1 is coupled with a drain of transistor N1. A gate of transistor N1 is coupled with the gate of transistor P1 and receives signal S. A drain of transistor N1 is coupled with the drain of transistor P1. A source of transistor N1 is coupled to a reference voltage VSS, which, in some embodiments, is ground.

Second switching device 422 includes another PMOS transistor P2. A gate of transistor P2 is coupled with the drains of transistor P1 and transistor N1. A source of transistor P2 is coupled to power supply VDD, which corresponds to power source 122 in FIG. 1. A drain of transistor P2 is coupled with one end of capacitor 11 and coupled to the inverting input of comparator 13.

In operation, in response to a logical high state of signal S, transistor P1 is turned off and transistor N1 is turned on. When transistor N1 is turned on, the gate of transistor P2 is pulled to reference voltage VSS at the source of transistor N1, which turns on transistor P2. Consequently, a current flows from supply voltage VDD at the source of transistor P2 and charges capacitor 11.

In contrast, in response to a logical low state of signal S, transistor P1 is turned on and transistor N1 is turned off. When transistor P1 is turned on, the gate of transistor P2 is pulled to supply voltage VDD at the source of transistor P1, which turns off transistor P2. Consequently, capacitor 11 is disconnected from the charging current.

In some embodiments, determining circuit 45 includes a latch circuit, for example, a D-type flip flop (DFF). A data input of the DFF receives signal COMP from comparator 13. An enable input E of the DFF receives a count value from counter 14. The DFF toggles in response to signal COMP indicating that voltage Vcap reaches Vref and outputs a count value COUNT.

In FIG. 4, circuits 42 and 45 are used for illustration. Other circuits that perform the functions of corresponding circuits 12 and 15 are within the contemplated scope of the present disclosure.

Method of Pulse Width Measurement Using Circuit in FIG. 1

Figure 5:
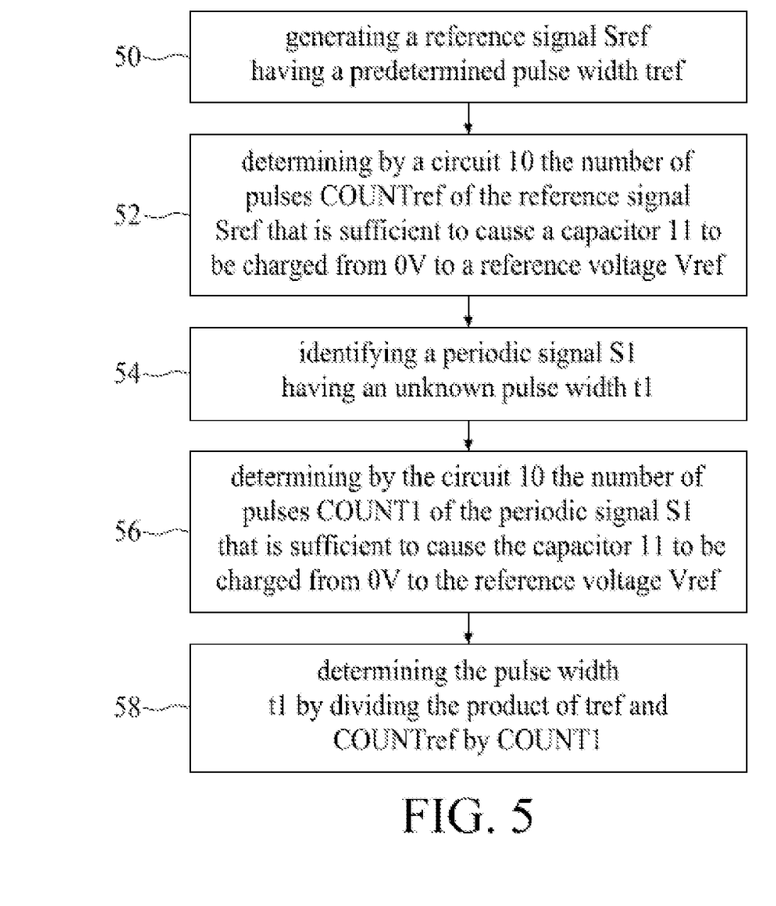
FIG. 5 is a flow diagram illustrating a method of pulse width measurement, in accordance with some embodiments.

FIG. 5 is a flow diagram illustrating a method of pulse width measurement, in accordance with some embodiments.

In operation 50, a reference signal Sref having a predetermined pulse width tref is generated.

In operation 52, by the circuit 10, the number of pulses COUNTref of reference signal Sref that is sufficient to cause a capacitor 11 to be charged from 0V to a reference voltage Vref is determined.

In operation 54, a periodic signal S1 having an unknown pulse width t1 is identified.

In operation 56, the number of pulses COUNT1 of the periodic signal S1 that is sufficient to cause the capacitor 11 to be charged from 0V to the reference voltage Vref is determined by circuit 10.

In operation 58, the pulse width t1 is determined by dividing the product of tref and COUNTref by COUNT1 as follows.

$$t1 = (tref * COUNTref)/COUNT1$$

In some embodiments of the present disclosure, a circuit comprises a charging circuit, a comparator, and a determining circuit. The charging circuit is configured to charge a capacitive device in response to a periodic signal. The comparator is configured to compare a voltage across the capacitive device with a reference voltage. The determining circuit is configured to determine the number of pulses COUNT of the periodic signal in response to a signal from the comparator indicating that the voltage across the capacitive device reaches the reference voltage.

In some embodiments of the present disclosure, a method is provided. In the method, a number of pulses associated with a reference signal that has a predetermined pulse width is obtained by a circuit and in a predetermined time period. A number of pulses associated with a periodic signal is also determined by the circuit and in the predetermined time period. The pulse width of the periodic signal is determined based on the predetermined time period, the number of pulses associated with the reference signal, and the number of pulses associated with the periodic signal.

In some embodiments of the present disclosure, another method is provided. A reference signal having a predetermined pulse width is generated. The number of pulses of the reference signal is determined by a circuit in a predetermined time period. A number of pulses of a periodic signal having an unknown pulse width is determined by the circuit and in the predetermined time period. The unknown pulse width is determined by dividing the product of the predetermined pulse width and the number of pulses of the reference signal by the number of pulses of the periodic signal.

A number of embodiments of the disclosure have been described. It will nevertheless be understood that various modifications may be made without departing from the spirit and scope of the invention. For example, some transistors are shown to be N-type and some others are shown to be P-type, but the disclosure is not limited to such a configuration because. Embodiments of the disclosure are applicable in variations and/or combinations of transistor types. Additionally, some signals are illustrated with a particular logic level to operate some transistors (e.g., activated high, deactivated low, etc.), but selecting different levels and/or transistors are within the contemplated scope of the present disclosure.

The above description includes exemplary steps, but these steps are not necessarily required to be performed in the order shown. Steps may be added, replaced, changed order, and/or eliminated as appropriate, in accordance with the spirit and scope of the invention. Accordingly, the scope of the present disclosure should be determined with reference to the following claims, along with the full scope of equivalences to which such claims are entitled.

What is claimed is:

1. A circuit, comprising:
   a charging circuit configured to charge a capacitive device with a charging current in response to a periodic signal;
   a comparator configured to compare a voltage across the capacitive device with a reference voltage having a predetermined reference voltage level;
   a counter configured to count a number of pulses of the periodic signal; and
   a determining circuit electrically coupled to the counter and configured to determine the number of pulses of the periodic signal in response to a signal from the comparator indicating that the voltage across the capacitive device reaches the predetermined reference voltage level,
   wherein
   a pulse width of the periodic signal is obtained based on a relationship:

$$t1 = tref * COUNTref/COUNT1$$

where t1 represents the pulse width of the periodic signal, tref represents a predetermined pulse width of a reference signal, COUNTref represents a predetermined number of pulses of the reference signal sufficient to cause the capacitive device to be charged to the predetermined reference voltage level with the charging current, and COUNT1 represents the number of pulses of the periodic signal.

2. The circuit of claim 1, wherein the determining circuit includes a D-type flip flop.

3. The circuit of claim 1, wherein the charging circuit is configured to provide the charging current to charge the capacitive device in response to a first logical state of the periodic signal, and to disconnect the capacitive device from the charging current in response to a second logical state of the periodic signal.

4. The circuit of claim 1, wherein the charging circuit includes a current source configured to generate a tunable current as the charging current.

5. The circuit of claim 1, wherein the charging circuit comprises a first switching device and a second switching device, wherein the first switching device includes an inverter.

6. The circuit of claim 5, wherein the first switching device is configured to cause the second switching device to electrically couple the capacitive device to a power supply in response to the periodic signal.

7. The circuit of claim 1, wherein the comparator includes a non-inverting input to receive the reference voltage and an inverting input to receive the voltage across the capacitive device.

8. The circuit of claim 1 further comprising a selecting device configured to select the periodic signal or the reference signal to cause the charging circuit to charge the capacitive device,
wherein
the charging circuit is further configured to charge the capacitive device with the charging current in response to the reference signal;
the counter is further configured to count the number of pulses of the reference signal; and
the determining circuit is further configured to determine the number of pulses of the reference signal in response to the signal from the comparator indicating that the voltage across the capacitive device reaches the predetermined reference voltage level.

9. The circuit of claim 8, wherein the selecting device includes a multiplexer.

10. The circuit of claim 1, wherein the determining circuit comprises a latch circuit configured to latch the number of pulses of the periodic signal in response to the signal.

11. A method, comprising:
charging, in response to a reference signal, a capacitive device with a charging current to reach a predetermined reference voltage level;
determining a number of pulses associated with the reference signal during performing charging the capacitive device in response to the reference signal, the reference signal having a predetermined pulse width;
charging, in response to a periodic signal, the capacitive device with the charging current to reach the predetermined reference voltage level;
determining a number of pulses associated with a periodic signal during performing charging the capacitive device in response to the periodic signal; and
determining a pulse width of the periodic signal based on the predetermined pulse width of the reference signal, the number of pulses associated with the reference signal, and the number of pulses associated with the periodic signal.

12. The method of claim 11, wherein the predetermined pulse width of the reference signal, the number of pulses associated with the reference signal, the pulse width of the periodic signal and the number of pulses associated with the periodic signal have a following relationship:

$$tref*COUNTref=t1*COUNT1$$

where tref represents the predetermined pulse width of the reference signal, COUNTref represents the number of pulses associated with the reference signal, t1 represents the pulse width of the periodic signal, and COUNT1 represents the number of pulses associated with the periodic signal.

13. The method of claim 11, wherein
charging, in response to the reference signal, the capacitive device is performed by a charging circuit; and
charging, in response to the periodic signal, the capacitive device is performed by the charging circuit.

14. The method of claim 13, wherein
charging, in response to the reference signal, the capacitive device comprises:
a comparator comparing a voltage across the capacitive device with a reference voltage having the predetermined reference voltage level and generating a first signal indicating that the voltage across the capacitive device reaches the predetermined reference voltage level; and
charging, in response to the periodic signal, the capacitive device comprises:
the comparator comparing the voltage across the capacitive device with the reference voltage and generating a second signal indicating that the voltage across the capacitive device reaches the predetermined reference voltage level.

15. The method of claim 14, wherein
determining the number of pulses associated with the reference signal comprises:
a counter counting the number of pulses of the reference signal; and
a determining circuit determining the number of pulses of the reference signal from the counter in response to the first signal from the comparator; and
determining the number of pulses associated with the periodic signal comprises:
the counter counting the number of pulses of the periodic signal; and
the determining circuit determining the number of pulses of the periodic signal from the counter in response to the second signal from the comparator.

16. The method of claim 13, further comprising a selecting device selecting one of the reference signal and the periodic signal as an input to the charging device.

17. A method, comprising:
generating a reference signal having a predetermined pulse width;
determining a number of pulses of the reference signal sufficient to cause a capacitive device to be charged to a predetermined reference voltage level with a charging current;
determining a number of pulses of a periodic signal sufficient to cause the capacitive device to be charged to the predetermined reference voltage level with the charging current; and
determining a pulse width of the periodic signal by dividing the product of the predetermined pulse width and the number of pulses of the reference signal by the number of pulses of the periodic signal.

18. The method of claim 17, wherein
determining the number of pulses of the reference signal comprises:
a charging circuit charging the capacitive device in response to the reference signal; and
determining the number of pulses of the periodic signal comprises:
the charging circuit charging the capacitive device in response to the periodic signal.

19. The method of claim 18, wherein
determining the number of pulses of the reference signal further comprises:
a comparator comparing a voltage across the capacitive device with a reference voltage having the predetermined reference voltage level;
determining the number of pulses of the periodic signal further comprises:
the comparator comparing the voltage across the capacitive device with the reference voltage.

20. The method of claim 19, wherein
determining the number of pulses of the reference signal further comprises:
a determining circuit determining the number of pulses of the reference signal in response to a first signal from the comparator indicating that the voltage across the capacitive device reaches the predetermined reference voltage level; and
determining the number of pulses of the periodic signal further comprises:
the determining circuit determining the number of pulses of the periodic signal in response to a second signal from the comparator indicating that the voltage across the capacitive device reaches the predetermined reference voltage level.

\* \* \* \* \*